(12) United States Patent
Fang et al.

(10) Patent No.: US 6,953,925 B2
(45) Date of Patent: Oct. 11, 2005

(54) MICROLENS INTEGRATION

(75) Inventors: Ming Fang, Plano, TX (US); Fuchao Wang, Plano, TX (US); Hai Ding, Carrollton, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 212 days.

(21) Appl. No.: 10/424,482

(22) Filed: Apr. 28, 2003

(65) Prior Publication Data

US 2004/0211884 A1 Oct. 28, 2004

(51) Int. Cl.$^7$ .......................... H01L 31/00; H01L 27/00; H01L 31/062; H01L 31/113; G02B 27/10
(52) U.S. Cl. .............................. 250/214.1; 250/208.1; 359/620; 257/292
(58) Field of Search .......................... 250/214.1, 208.1; 359/619–623, 626

(56) References Cited

U.S. PATENT DOCUMENTS

| | | | |
|---|---|---|---|
| 4,722,582 A | | 2/1988 | Modone et al. |
| 4,870,470 A | * | 9/1989 | Bass et al. .................. 257/324 |
| 5,711,890 A | * | 1/1998 | Hawkins et al. ............... 216/24 |
| 5,824,236 A | * | 10/1998 | Hawkins et al. ............... 216/26 |
| 6,043,481 A | * | 3/2000 | Tan et al. .................. 250/216 |
| 6,157,017 A | | 12/2000 | Kim |
| 6,171,883 B1 | * | 1/2001 | Fan et al. .................... 438/65 |
| 6,221,687 B1 | | 4/2001 | Abramovich |
| 6,307,243 B1 | | 10/2001 | Rhodes |
| 6,580,109 B1 | * | 6/2003 | Thomas et al. ............. 257/292 |
| 2004/0080005 A1 | * | 4/2004 | Yamamoto .................. 257/432 |

OTHER PUBLICATIONS

CRC Handbook of Chemistry and Physics, 82nd edition, CRC Press, Inc., pp. 10–217, 12–157, 12–171, 12–172.*

\* cited by examiner

*Primary Examiner*—David Porta
*Assistant Examiner*—Suezu Ellis
(74) *Attorney, Agent, or Firm*—Lisa K. Jorgenson; Peter J. Thomas

(57) ABSTRACT

A microlens of an inorganic material having a relatively high index of refraction is formed with a convex lower surface for refracting light from above through an underlying spacer layer to converge on a photodiode therebelow. The microlens and photodiode may be replicated in an array of such elements along with color filters and CMOS circuit elements on a semiconductor chip to provide an image sensor. The spacer layer, which has a relatively low refractive index, is subjected to a selective isotropic etch through an opening in an etch mask to define a concave surface that forms an interface with the convex lower surface of the microlens upon subsequent conformal deposition of the material of the microlens.

8 Claims, 4 Drawing Sheets

MICROLENS INTEGRATION

BACKGROUND OF THE INVENTION

The present invention generally relates to optical image sensors, and more particularly to the integration of a microlens with an underlying photocell on a semiconductor chip as part of an optical image sensor.

The use of microlens arrays in imaging devices, such as cameras, is known in the art. U.S. Pat. No. 6,307,243 discloses a microlens array for use in a solid-state CMOS imager in which a plano-convex microlens and an underlying photodiode define one of many pixels of an array. The principal element of each microlens is fabricated from an organic material that is heat-treated to provide a convex upper surface and a planar lower surface.

U.S. Pat. No. 6,157,017 discloses a solid-state imaging device in which an array of microlenses is formed by reflowing a two-dimensional array of spaced photoresist regions. Each resulting microlens has a convex upper surface, a planar lower surface, and an index of refraction in a range between about 1.65 and 1.70. Red, green and blue filters are included, one under each microlens with a photodiode under each filter. Concave depressions are formed in a dispersion layer between adjacent microlenses to contribute to focusing of light towards the photodiodes.

U.S. Pat. No. 6,221,687 discloses a color CMOS image sensor having a matrix of pixels including microlenses, each microlens being located beneath a color filter layer and above a photodiode. Each microlens is formed by depositing a dielectric layer of a material such as silicon nitride, forming a lens-shaped photoresist portion on the dielectric layer, and then performing an anisotropic reactive ion etching process that copies the lens-like shape of the photoresist portion into the dielectric layer. The result is a dielectric layer having a planar lower surface and a microlens portion having a convex upper surface.

It would be desirable to provide a simplified process for forming a microlens in an optical image sensor while enhancing the signal-generating performance of the sensor.

SUMMARY OF THE INVENTION

According to a principal object of the invention, an optical image sensor is fabricated on a semiconductor substrate with CMOS circuit elements and an array of light-sensitive elements such as photocells, each photocell being disposed beneath a microlens formed from a material having a relatively high refractive index, each microlens having a convex lower surface for refracting light so that it converges on a light-sensitive region of the underlying photocell. The preferred process according to the invention includes isotropically etching the upper surface of a spacer layer having a relatively low refractive index through an opening in an etch mask to form a concave surface against which the convex lower surface of a microlens is formed by a subsequent deposition step. The inventive process can be used to fabricate various structures having different applications, including the disclosed optical image sensor.

The novel features believed to be characteristic of the invention are set forth in the appended claims. The nature of the invention, however, as well as its essential features and advantages, may be understood more fully upon consideration of illustrative embodiments, when read in conjunction with the accompanying drawings, wherein:

DETAILED DESCRIPTION

Figure 1:
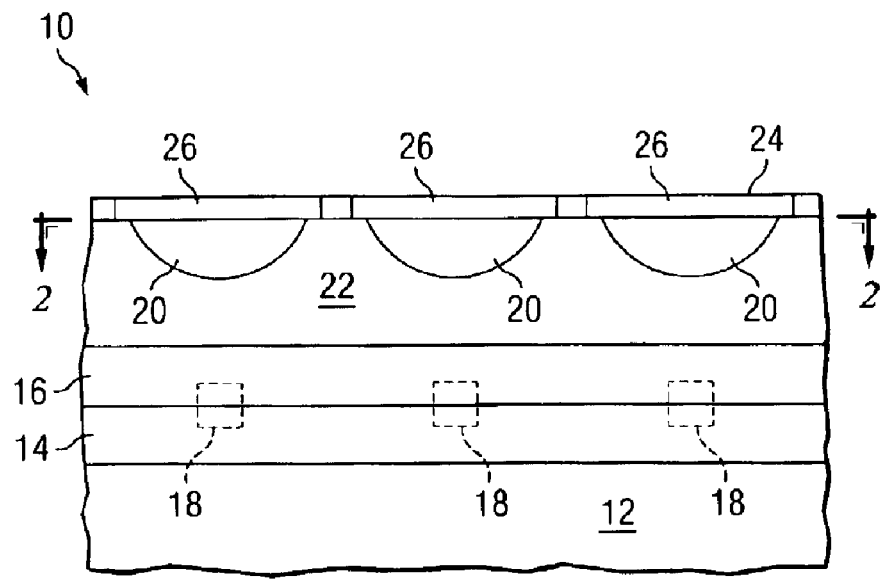
FIG. 1 is a schematic vertical cross-section of a portion of sensor device embodying the present invention, showing part of a semiconductor chip with photocells and microlenses formed thereon.
Figure 2:
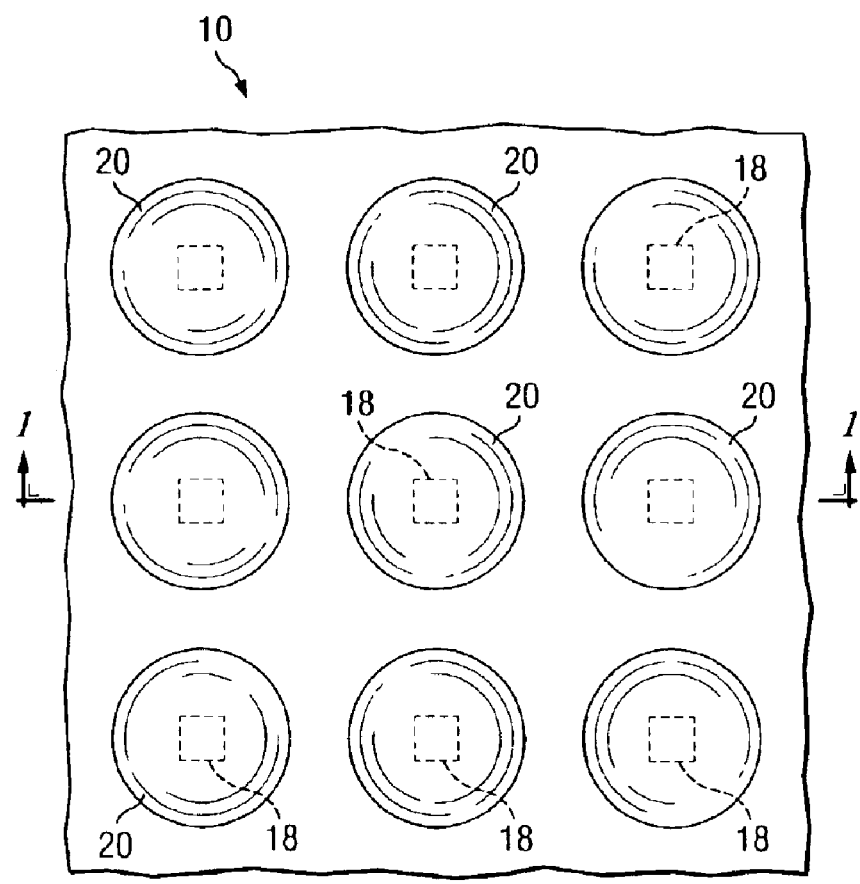
FIG. 2 is a plan view of the layout of the microlenses of FIG. 1.

With reference to FIGS. 1 and 2, an optical image sensor of the present invention is illustrated and designated generally by reference numeral 10. The sensor device 10 is preferably supported by a semiconductor substrate 12, shown partially in FIG. 1. The substrate 12 may be a conventional monocrystalline silicon substrate initially existing in wafer form and ultimately being separated into individual chips following the completion of wafer processing, in accordance with standard chip fabrication processes. FIG. 1. also shows an active layer 14 disposed atop the substrate 12. The active layer 14 and substrate 12 together define a body of monolithic semiconductor material produced by conventional epitaxial deposition of monocrystalline silicon on the substrate. An interconnect layer 16 is disposed atop the active layer 14. The interconnect layer 16 includes insulators and conductors (not shown) that can be formed using well-known semiconductor processing techniques. Some of such structures are described more fully below.

In accordance with one aspect of the invention, photocells 18, which are shown in dashed outline in FIGS. 1 and 2, are arranged in a two-dimensional array. It will be appreciated that FIG. 2 depicts only nine photocells 18 of a much larger array. As schematically depicted in FIG. 1, portions of each photocell 18 lie in the active layer 14 and portions extend up into the interconnect layer 16. Juxtaposed above each photocell 18 is a microlens 20. A spacer layer 22 is disposed atop the interconnect layer 16 and separates the bottom of each microlens 20 from the corresponding photocell 18 therebelow.

Each microlens 20 serves to refract light passing therethrough so that it converges on its corresponding photocell 18. Each microlens 20 has a convex lower surface and a planar upper surface, as shown in FIG. 1. Also shown in FIG. 1 is an optional filter layer 24 that includes color filters 26, each aligned above a corresponding microlens 20. The filter layer 24 may include individual red, green, and blue filters 26 arranged in a regular pattern to permit the generation of signals by the photocells that can be assembled by processing circuitry (not shown) to define with digital data a color image to which the sensor 10 is exposed.

Figure 3:
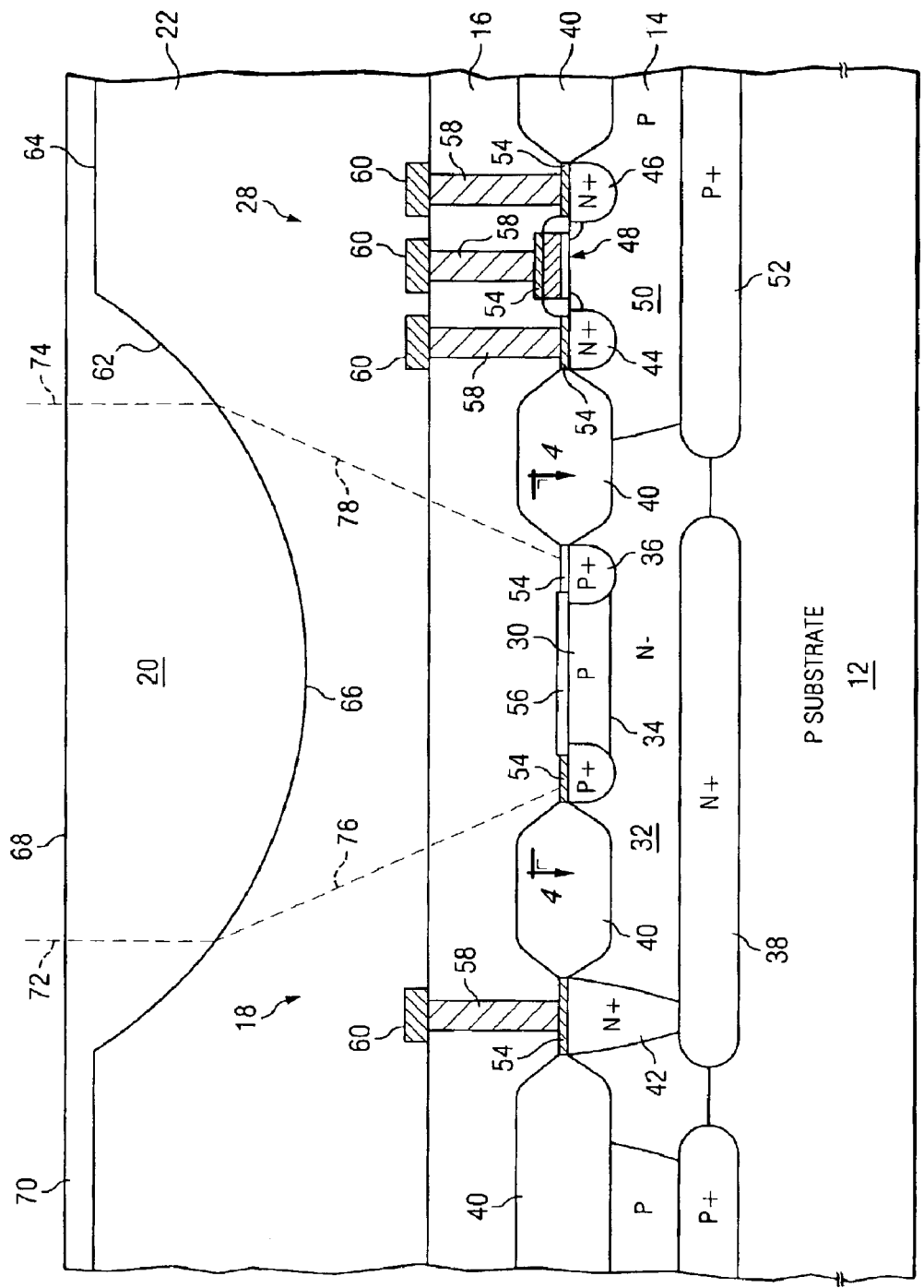
FIG. 3 is an enlarged, more detailed view of a microlens and photocell in a schematic cross-section similar to FIG. 1.

Referring to FIG. 3, one possible structure of a photocell 18 is shown with an overlying microlens 20 and an adjacent NMOS transistor 28. The inclusion of transistor 28 is intended to schematically depict the compatibility of the photocell 18 with conventional CMOS circuit elements rather to show an actual circuit layout, which could be implemented in various different ways. It is an advantageous aspect of the invention that the photocells 18 and microlenses 20 are capable of being fabricated with other circuit elements on a common chip using state-of-the-art BiCMOS process technology. Transistors, such as NMOS transistor 28, can be provided within the array of photocells and at its periphery to provide addressing, photocell sensing, and signal processing functions integrated on a single semiconductor chip by applying known circuit architectures and conventional chip fabrication technologies.

The substrate 12 may be a P-type silicon substrate, which will be understood to be much thicker than the layers 14 and 16 formed thereon. The photocell 18 preferably is a PN junction photodiode having a P-type anode region 30 disposed above a lightly doped N-type drift region 32, a PN junction 34 being defined therebetween. A heavily doped P-type anode contact region 36 surrounds the anode region 30. A heavily doped N-type buried cathode region 38 lies beneath the PN junction 34. Thick field oxide portions 40 are provided in accordance with well-known techniques for separating regions within the active layer 14. Laterally spaced to the left of the anode contact region 36 in the view of FIG. 3 is a heavily doped cathode contact region 42, which extends downward from an upper surface portion of the active layer 14 to join a laterally extended portion of the buried cathode region 38.

Formed to the right of the photocell 18 in the view of FIG. 3 is NMOS transistor 28, which includes source 44 and drain 46 regions disposed on opposite sides of a gate structure 48, which has a well-known construction that need not be described in detail. The source 44 and drain 46 regions extend down into a P-type region 50 of the active layer 14, which in turn extends down to a heavily doped P-type buried layer 52.

The buried layers 38 and 52 can be formed by selectively implanting dopants into patterned areas of the upper surface of the substrate 12 prior to formation of layer 14. Following successive N-type and P-type implants in patterned areas corresponding to buried layers 38 and 52, a lightly doped N-type epitaxial layer is grown on the upper surface of the substrate 12. As the epitaxial silicon grows at an elevated temperature, the N-type and P-type dopants that had been implanted into the upper surface of the substrate 12 diffuse downward into the substrate 12 and upward into lower portions of the epitaxial layer to assume the configurations of buried layers 38 and 52 substantially as shown in FIG. 3. In the final device structure, the drift region 32 comprises a portion of the lightly doped N-type material of the epitaxial layer. Regions 30, 36, 42, 44, 46, and 50 are formed by conventional doping of patterned areas within the epitaxial layer to define the active layer 14.

Silicide contacts 54 are disposed atop surface portions of the active layer 14 and atop the gate structure 48 to facilitate low resistance contact formation. A refractory metal, such as titanium, may be used to form silicide contacts 54 according to known techniques. Since it is necessary to allow light to pass through the structure and generate electron-hole pairs in the vicinity of the PN junction 34, a thin film of silicon nitride 56, which serves as an antireflective film, is disposed atop the anode region 30, leaving silicon surface portions uncovered above the anode contact region 36. This enables silicide contacts 54 to be formed above the anode contact region 36 while blocking silicidation on the surface of the anode region 30.

After silicidation, interconnect layer 16 is formed. In practice, layer 16 may be formed by depositing more than one type of dielectric material in successive sublayers, the uppermost of which may be planarized by conventional chemical mechanical polishing (CMP) techniques. At least the portions of the layer 16 over the anode region 30 of the photocell 18 are transparent. It may be advantageous to include a light-blocking screen (not shown) over the transistors of the device so that their electrical characteristics will not be affected by incoming light.

Figure 4:
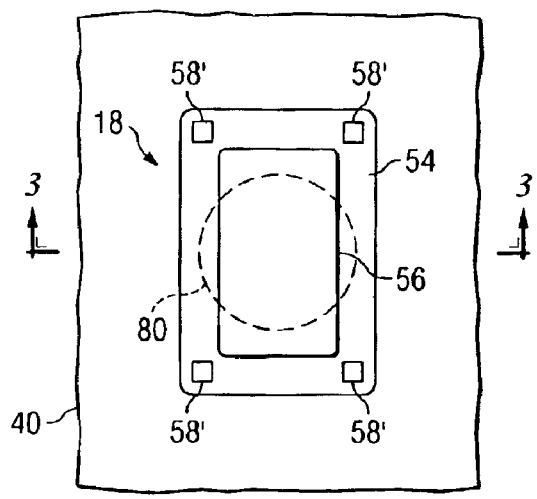
FIG. 4 is a plan view of an internal portion of FIG. 3 taken along line 4—4 in FIG. 3.

Shown in FIG. 3 extending through the dielectric material of the layer 16 are tungsten plugs 58. A top view of the nitride layer 56 and surrounding silicide contact 54 is shown in FIG. 4, in which redundant tungsten plugs 58' are shown in the corners. The tungsten plugs 58' are not seen in FIG. 3 because the cross-section of FIG. 3 is taken through the center of the anode region 30 for clarity of illustration. FIG. 3 shows aluminum contacts 60 that contact each of the tungsten plugs 58. Similar aluminum contacts (not shown) contact the tungsten plugs 58' of FIG. 4, in the same manner. Such aluminum contacts are elements of a complex interconnect arrangement that enables electrical communication within the sensor device.

In accordance with an important aspect of the invention, FIG. 3 shows a preferred microlens structure aligned to refract light downward to converge on the anode region 30 of the photocell 18. Preferably, the spacer layer 22 comprises a transparent inorganic dielectric material having a relatively low refractive index, and the microlens 20 comprises a transparent inorganic dielectric material having a relatively high refractive index. Most preferably, for fabrication simplicity, the spacer layer 22 consists essentially of silicon dioxide ($SiO_2$), and the microlens 20 consists essentially of silicon nitride ($Si_3N_4$). The spacer layer 22 has a bowl-shaped upper surface portion 62 and a surrounding planar shelf 64. The microlens 20 has a convex lower surface 66 and a planar upper surface 68. The bowl-shaped upper surface 62 of the spacer layer 22 and the convex lower surface 66 of the microlens 20 meet to define an interface at which light is refracted. The dielectric material that forms the microlens 20 optionally extends laterally from the peripheral edges of the convex surface 66 to define portions 70 that overlie the shelf 64 of the spacer layer 22.

It will be appreciated by those skilled in the art that the degree to which light is refracted at a surface depends on the difference in the refractive indices of the two materials (the incident medium and the refractive medium) that come together at the refracting surface or interface. According to Snell's Law, the index of refraction of the incident medium times the sine of the angle of incidence equals the index of refraction of the refractive medium times the sine of the angle of refraction. The angles of incidence and refraction are measured from a line that is normal to the refracting surface at the point that a light ray passes through the surface.

As an illustrative example, FIG. 3 shows the refraction of two light rays entering microlens 20 along the paths indicated by dashed lines 72 and 74. The incident light rays 72 and 74 pass through the planar surface 68 of the microlens 20 without refraction, since they are each parallel to a line normal to surface 68. In other words, solving Snell's Law for an angle of incidence of zero degrees, gives an angle of reflection of zero degrees, since the sine of zero is zero. However, these light rays are refracted at the convex surface 66, since they each impinge on that surface at an angle to a line normal to that surface. Light ray 72 is refracted as light ray 76, and light ray 74 is refracted light ray 78. The depicted refraction occurs since the index of refraction of the refractive medium (spacer layer 22) is less than the index of refraction of the incident medium (microlens 20).

In accordance with Snell's Law, refracted light ray 76 is oriented at an angle to the line normal to the convex surface 66 that is greater than the angle formed by the incident light ray 72 and the normal line. The same relationship exists between the refracted light ray 78 and incident light ray 74. The point at which light rays 76 and 78 hypothetically would intersect, if layer 22 were sufficiently thick, defines the focal length of the lens system. In other words, the microlens 20 causes the light rays 76 and 78 to converge toward a focal point. However, because the photocell 18 is located beneath the convex surface 66 at a distance that is less than the focal length, the refracted light rays converge in a circular area 80 at the upper surface of the photocell 18, as depicted in FIG. 4. The P-type and N-type material in the vicinity of the PN junction 34 beneath the area 80 of light convergence defines the light-sensitive region of the photocell 18 at which electron-hole pairs are generated in response to light energy, thereby producing a corresponding diode current signal.

It will be appreciated from FIG. 4 that a rectangular layout for the photocell 18 permits positioning of the tungsten plugs 58' in the corners so that the upper portions of the tungsten plugs 58' and their aluminum contacts (not shown) will not interfere with the converging light rays. As an optional feature, transparent conductors (not shown) can be used within the interconnect layer 16 including over the anode region 30 of the photocell 18 to reduce the chip area devoted to interconnect circuitry. Certain metal oxides, such as indium-tin oxide, are transparent and may be used for such purpose.

Silicon nitride and silicon dioxide are the presently preferred materials for the microlens 20 and the spacer layer 22, respectively. These transparent materials have significantly different indices of refraction, and can be readily deposited using conventional processing techniques that are compatible with state-of-the-art BiCMOS processes. Conventional silicon nitride ($Si_3N_4$) has a refractive index of about 2.0, and silicon dioxide ($SiO_2$) has a refractive index of about 1.46. These values will vary slightly with process variations. The difference between these two refractive indices (2.0–1.46=0.54) affects the focal length of the lens system. It should be noted also that both of these materials have sufficiently high quantum energy band gaps such that essentially no photon energy absorption occurs as light passes through the microlens 20 and spacer layer 22.

Increasing the refractive index of the microlens 20 above 2.0 and/or decreasing the refractive index of the spacer layer 22 below 1.46 will advantageously shorten the focal length of the lens system of FIG. 3. Such variations are possible by selecting different materials for the microlens 20 and spacer layer 22. It is known that certain materials selected from the group consisting of metal oxides, mixed metal oxides, conductive metal oxides, zinc sulfide, silicon nitride, silicon carbide, and silicon oxycarbide exhibit refractive indices up to about 2.6. It is also known that certain materials selected from the group consisting of metal oxides, mixed metal oxides, magnesium fluoride, aluminum oxide, and aluminum nitride exhibit refractive indices down to about 1.25. See U.S. Pat. No. 6,165,598. Therefore, without undue experimentation, it is contemplated that the refractive index of the microlens 20 could be increased significantly above the 2.0 value of the presently preferred silicon nitride material. Also, without undue experimentation, it is contemplated that the refractive index of the spacer layer 22 could be reduced significantly below the 1.46 value of the presently preferred silicon dioxide material. Trade-offs between process simplicity and structural enhancement must be considered in the selection of the materials for the microlens 20 and spacer layer 22.

Additionally, although conventional silicon nitride ($Si_3N_4$) has a ratio of 3 silicon atoms to 4 nitride atoms, it is known that the silicon to nitrogen ratio can be increased to produce silicon-rich silicon nitride having a refractive index significantly in excess of 2.0. See U.S. Pat. Nos. 4,870,470; and 6,326,321. Chemical vabor deposition (CVD) of silicon nitride is ordinarily accomplished using a gas mixture of a silicon precursor gas and ammonia ($NH_3$), typically using nitrogen as a carrier gas. The silicon precursor gas is typically silane ($SiH_4$), disilane ($Si_2H_6$), or dichlorosilane ($SiH_2Cl_2$). See U.S. Pat. No. 6,121,133. One can control the silicon precursor gas flow rate into the CVD reactor to achieve deposition of a silicon-rich silicon nitride layer having a desired silicon to nitrogen ratio. Therefore, one can effectively tune the focal length of the lens system of FIG. 3 by adjusting the silicon to nitrogen ratio to deposit a layer having a selected index of refraction significantly in excess of 2.0, and fabricating the microlens 20 from such a silicon-rich silicon nitride layer.

Figure 5:
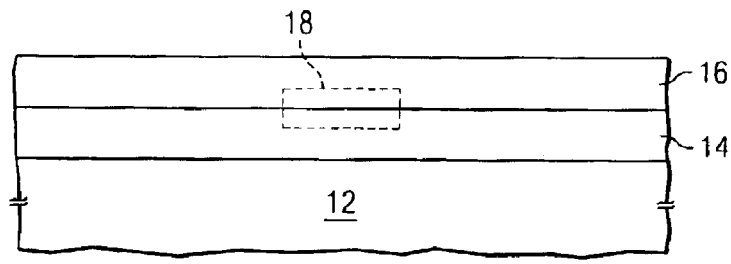
FIGS. 5–9 are schematic cross-sections showing stages in the preferred process for fabricating the structure of FIG. 3.

Referring now to FIGS. 5–9, a preferred method for making the microlens structure of FIG. 3 will be described. FIG. 5 schematically depicts the structure at a stage at which the active layer 14 and interconnect layer 16 have been formed atop the substrate 12. The photocell 18, indicated in dashed outline, has also been formed within the layers 14 and 16.

Figure 6:
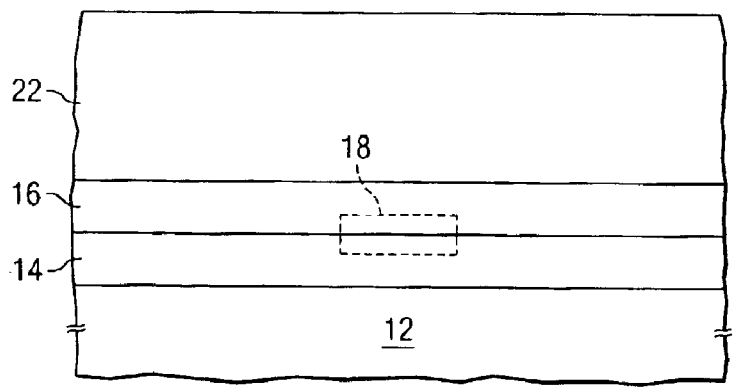

Next, referring to FIG. 6, a relatively thick spacer layer 22 is deposited atop the interconnect layer 16. As noted above, the spacer layer 22 preferably comprises a transparent inorganic dielectric material having a relatively low index of refraction. The material of layer 22 most preferably consists essentially of silicon dioxide, which may be formed using conventional CVD techniques. Elements other than silicon and oxygen will be included in layer 22, some of which, like hydrogen, are unavoidable because they are included in the reactant gasses or carrier gas. Insignificant amounts of impurities will also be present. Small amounts of dopants, such as boron and/or phosphorus, may also be added.

Figure 7:
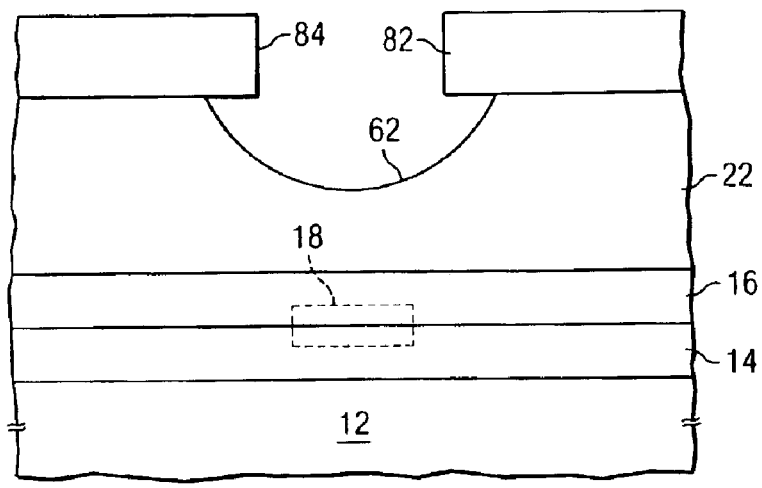

FIG. 7 shows the structure following several additional steps. A photoresist layer is deposited atop the spacer layer 22, and then lithographically patterned using known techniques to produce an etch mask 82 having a cylindrical opening 84 therein axially aligned above the light-sensitive region of the photocell 18. Then, the spacer layer 22 is isotropically etched through the opening 84, preferably using a diluted hydrofluoric acid solution. The etch duration is controlled to produce a generally spherical, bowl-shaped surface 62 of a desired depth. It will be appreciated from FIG. 7 that the isotropic etch undercuts the resist mask 82 so that the lateral extent of the bowl-shaped surface 62 is wider than the diameter of the opening 84.

Figure 8:
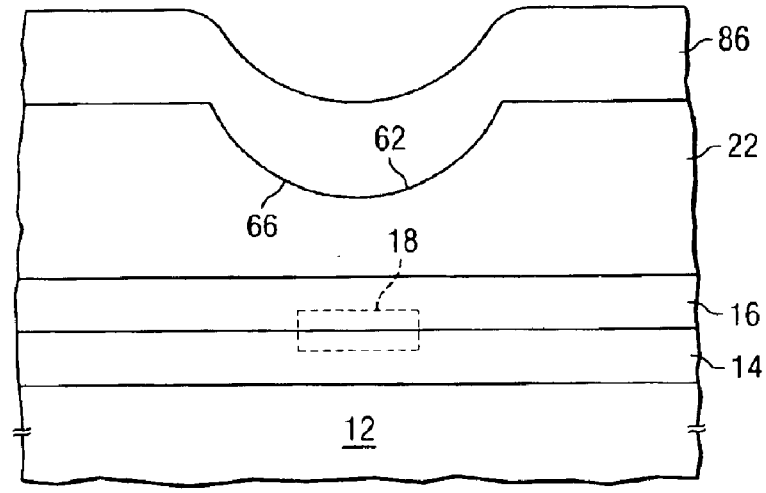

FIG. 8 shows the structure after the resist 82 has been stripped away and a conformal layer 86 of a transparent material having a relatively high index of refraction has been deposited. Preferably, layer 86 comprises an inorganic dielectric material. The layer 86 has a generally spherical, convex surface 66 conforming to the bowl-shaped surface 62 of the spacer layer 22.

Most preferably, the layer 86 consists essentially of silicon nitride formed by a conventional CVD procedure using silane and ammonia. The layer 86 will include elements other than silicon and nitrogen, principally hydrogen, which is a product of the silane-ammonia reaction. Insignificant amounts of impurities will also be present. Other elements, such as oxygen, may also be added. The addition of oxygen may be used to form a layer of silicon oxynitride or silicon-rich oxynitride. If the deposition is controlled to deposit conventional silicon nitride ($Si_3N_4$), the layer 86 will have a refractive index of nearly about 2.0. As observed above, the flow rate of silane into the reactor can be increased by some amount compared to the conventional silicon nitride deposition process to produce a $Si_yN_x$ layer in which the ratio of y to x is greater than 3 to 4. This alternative will produce a silicon-rich silicon nitride layer with an index of refraction significantly in excess of 2.0.

One approach to providing a silicon-rich silicon nitride layer is to vary the gas flow into the reactor so that the lower portions of layer 86 have a higher silicon-to-nitrogen ratio than the upper portions. In other words, the material used to make the microlens has an optical density gradient that can be determined by controlling process parameters to permit the device designer to tune the focal length of the lens systems for optimum results.

Figure 9:
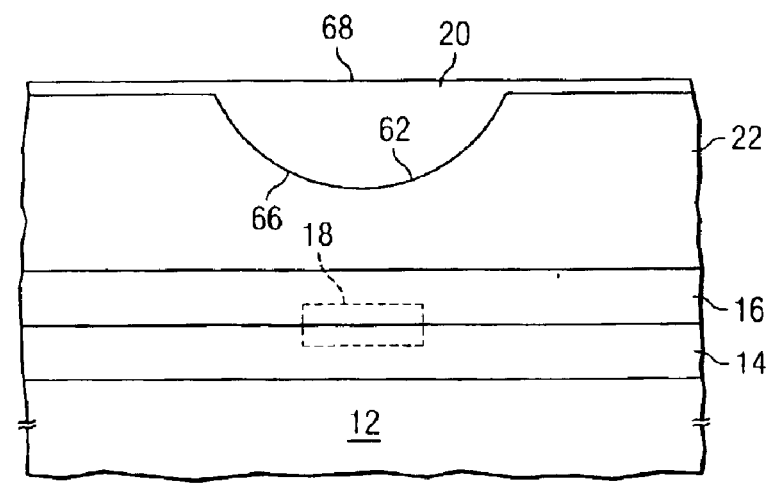

FIG. 9 shows the structure following a CMP step that provides a planarized upper surface 68 and defines the final shape of the microlens 20. Subsequent processing steps may be used to deposit a color filter layer, as discussed above with reference to FIG. 1. It will be appreciated that the microlens 20 and corresponding photocell 18 of FIG. 9 can be just one pair of such elements in a larger array within an optical image sensor.

From the foregoing description, it will be apparent that various advantageous results can be achieved by practicing important aspects of the invention. A more efficient optical image sensor can be constructed by integrating a microlens with a convex lower surface over each photocell of an array to increase the signal-to-noise ratio of each photocell compared to an array without such microlenses. The integration of such microlenses can also reduce the pixel size of the image sensor, enabling increased resolution. The ideal silicon nitride and silicon dioxide materials for the lens system are highly compatible with integrated circuit fabrication processes. The tunability of the refractive index of the microlens material, and the spacer layer material to a lesser extent, permits tailoring of the focal length of the lens system for structural design flexibility.

Further advantageous uses of the basic concepts described herein are within the scope of the invention. For example, the method described with respect to FIGS. 5–9 can be included in a sequence of fabrication steps for making microlens structures used to couple light signals from a source to one or more optical fibers. In such an application, the spacer layer 22 of FIG. 3 can be disposed atop an optical interface instead of atop a semiconductor chip, the optical interface containing the ends of one or more optical fibers.

As another example, microlens structures made according to the method of FIGS. 5–9 can be disposed atop a semiconductor substrate with intermediate active and interconnect layers similar to layers 14 and 16, but containing light sources, such as light-emitting diodes (LEDs), instead of photocells. A photoactive layer can be disposed atop an array of microlenses, and each of the LEDs can be selectively activated for imaging or diagnostic functions. The diagnostic applications include use of light-activated reactive layers or photoresponsive sensor layers that can identify specific chemical or biological agents.

Although preferred embodiments of the invention have been described in detail, it will be understood that various changes and substitutions can be made therein without departing from the spirit and scope of the invention as set forth in the appended claims.

What is claimed is:

1. An optically enhanced photo sensor, comprising:
a substrate;
a photocell disposed atop the substrate, the photocell having a light-sensitive region that converts radiation into electrical energy;
a spacer disposed atop the photocell; and
a lens disposed atop the spacer, the lens having a convex lower surface defining an interface with a correspondingly shaped upper surface portion of the spacer;
wherein the spacer and lens comprise inorganic transparent materials each having a refractive index, the refractive index of the lens being greater than the refractive index of the spacer such that light passing through the lens is refracted at the interface and caused to converge in an area covering most of the light-sensitive region of the photocell, wherein the material of the lens consists essentially of silicon-rich silicon nitride having a refractive index in excess of 2.0, and wherein the difference between the refractive index of the lens material and the refractive index of the spacer material is significantly in excess of 0.54.

2. The photo sensor of claim 1 wherein the spacer has a shelf portion that surrounds the lens, and the material of the lens extends laterally from the peripheral edges of the lens to overlie the shelf portion of the spacer, and wherein the material of the spacer consists essentially of silicon dioxide with a refractive index of about 1.46.

3. The photo sensor of claim 1 wherein the photocell comprises a photodiode characterized by regions formed in an active layer above the substrate, the photodiode having a P-type anode region disposed above a lightly doped N-type drift region, a PN junction being defined between the anode region and the drift region, the anode region having a generally rectangular outline in top view, a generally rectangular-shaped antireflective film being generally symmetrically disposed over the anode region, wherein the area of light convergence is circular with a diameter that is greater than the width of the antireflective film but less than the length of the antireflective film.

4. The photo sensor of claim 3 wherein the photodiode further includes:
a heavily doped P-type anode contact region surrounding the anode region at an upper surface of the active layer; and
contact means at at least one corner of the anode contact region, the corners of the anode contact region being outside the circular area of convergence of light impinging on the antireflective film.

5. An optical image sensor, comprising:
an array of photocells, each photocell having a light-sensitive region that converts radiation into electrical energy;
a transparent spacer layer disposed over the array of photocells, the spacer layer comprising a material having a first refractive index; and
an array of microlenses disposed on the spacer layer, each microlens being aligned above a corresponding photocell, each microlens having a convex lower surface facing the photocell therebelow and defining an interface with a correspondingly shaped upper surface portion of the spacer layer, the microlenses comprising a transparent material having a second refractive index;
wherein the first refractive index is less than the second refractive index such that light passing through each microlens converges in an area covering most of the light-sensitive region of the corresponding photocell, wherein the material of the microlenses consists essentially of silicon-rich silicon nitride having an index of refraction in excess of 2.0, and wherein the difference between the second refractive index and the first refractive index is significantly in excess of 0.54.

6. The optical image sensor of claim 5 wherein the transparent spacer layer has shelf portions that surround each microlens, and the material of the microlenses extends laterally from the peripheral edges of each microlens to overlie the shelf portions of the spacer, and wherein the material of the spacer layer consists essentially of silicon dioxide.

7. The optical image sensor of claim 5 wherein each photocell comprises a PN junction photodiode, each photodiode including P-type and N-type regions formed in a body of semiconductor material, and a generally rectangular-shaped antireflective thin film disposed on an upper surface of the semiconductor body beneath the spacer layer, the regions including a P-type anode region disposed above a lightly doped N-type drift region, the P-type anode region being contacted by the antireflective film and having a similar rectangular shape, wherein the area of light convergence is circular with a diameter that is greater than the width of the antireflective film but less than the length of the antireflective film.

8. The optical image sensor of claim 7 wherein each photodiode further includes:

a heavily doped P-type anode contact region surrounding the anode region at an upper surface portion of the photodiode; and contact means at at least one corner of the anode contact region, the corners of the anode contact being outside the circular area of convergence of light impinging on the antireflective film.

* * * * *